US012603643B2

(12) United States Patent
Aoyama et al.

(10) Patent No.: US 12,603,643 B2
(45) Date of Patent: Apr. 14, 2026

(54) FREQUENCY SELECTING/SWITCHING CIRCUIT

(71) Applicant: Mitsubishi Electric Corporation, Tokyo (JP)

(72) Inventors: Hiroyuki Aoyama, Tokyo (JP); Akimichi Hirota, Tokyo (JP); Hidenori Yukawa, Tokyo (JP); Toru Fukasawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 33 days.

(21) Appl. No.: 18/425,088

(22) Filed: Jan. 29, 2024

(65) Prior Publication Data

US 2024/0171163 A1     May 23, 2024

Related U.S. Application Data

(63) Continuation of application No. PCT/JP2021/030941, filed on Aug. 24, 2021.

(51) Int. Cl.
*H03K 5/00*          (2006.01)
*H03K 5/01*          (2006.01)
(52) U.S. Cl.
CPC ........... *H03K 5/01* (2013.01); *H03K 5/00006* (2013.01); *H03K 2005/00286* (2013.01)
(58) Field of Classification Search
CPC ..... H03K 5/00006; H03K 2005/00286; H03K 5/01; H03H 7/46
See application file for complete search history.

(56) References Cited

U.S. PATENT DOCUMENTS

| | | | | |
|---|---|---|---|---|
| 10,560,131 | B2 * | 2/2020 | Horita | ...................... H04B 1/18 |
| 11,264,971 | B2 * | 3/2022 | Mori | .................... H03H 9/6423 |

(Continued)

FOREIGN PATENT DOCUMENTS

| | | |
|---|---|---|
| JP | 8-321738 A | 12/1996 |
| JP | 2015-204629 A | 11/2015 |

OTHER PUBLICATIONS

International Search Report (PCT/ISA/210), issued in PCT/JP2021/030941, dated Nov. 9, 2021.

(Continued)

*Primary Examiner* — Tuan T Lam
(74) *Attorney, Agent, or Firm* — Birch, Stewart, Kolasch & Birch, LLP

(57)          ABSTRACT

A frequency selecting/switching circuit includes an input terminal, an output terminal, a two-way splitter circuit, a first phase-adjusting circuit, a second phase-adjusting circuit, a first switch, and a second switch. The two-way splitter circuit splits a signal inputted to the input terminal into first and second frequency components and outputs them to its first output end and second output end, respectively. The first output end and second output end of the two-way splitter circuit are connected to a first end of the first phase-adjusting circuit and a first end of the second phase-adjusting circuit, respectively. A second end of the first phase-adjusting circuit and a second end of the second phase-adjusting circuit are connected to the first switch and the second switch, respectively. Each switch switches an output of a signal inputted to its input end, to its output end between a conductive state and a non-conductive state.

1 Claim, 5 Drawing Sheets

(56)           References Cited

U.S. PATENT DOCUMENTS

2013/0028356 A1*  1/2013  Heck .................... H03D 7/1441
                                                        375/344
2015/0295596 A1*  10/2015  Wloczysiak .............. H04L 5/08
                                                        370/297

OTHER PUBLICATIONS

Japanese Notice of Reasons for Refusal, issued in corresponding Patent Application 2023-543514, dated Nov. 7, 2023.

* cited by examiner

[Fig. 1]
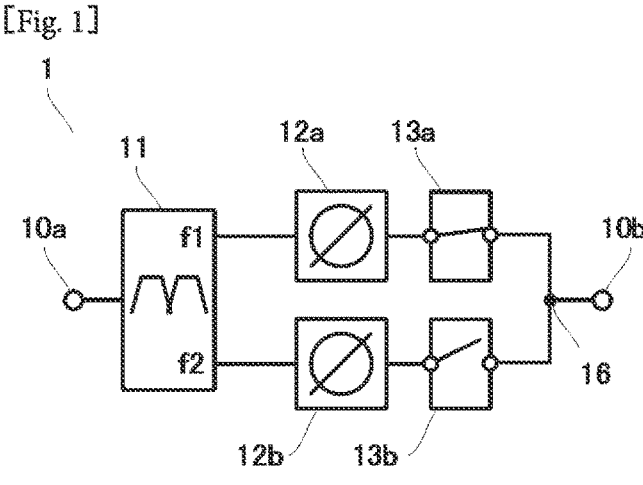
[Fig. 2]
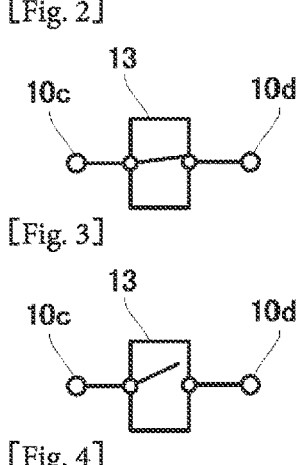
[Fig. 3]
[Fig. 4]
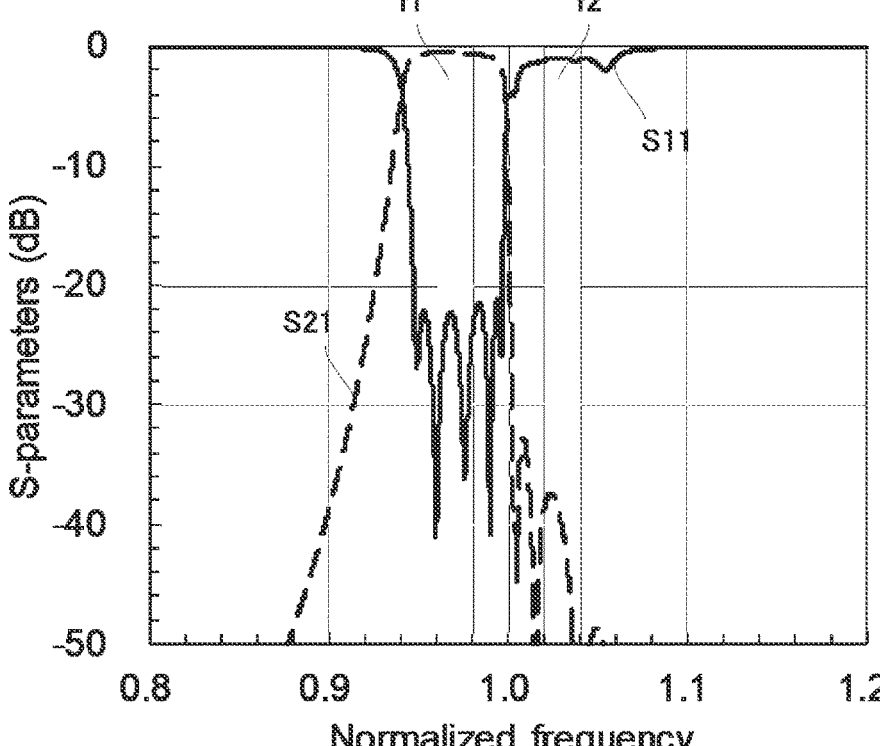

[Fig. 5]
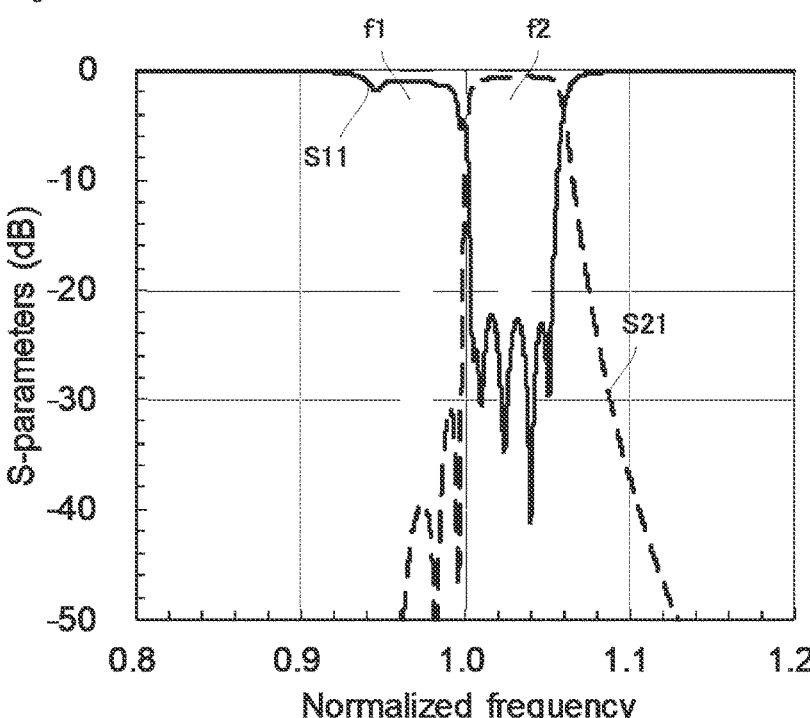
[Fig. 6]
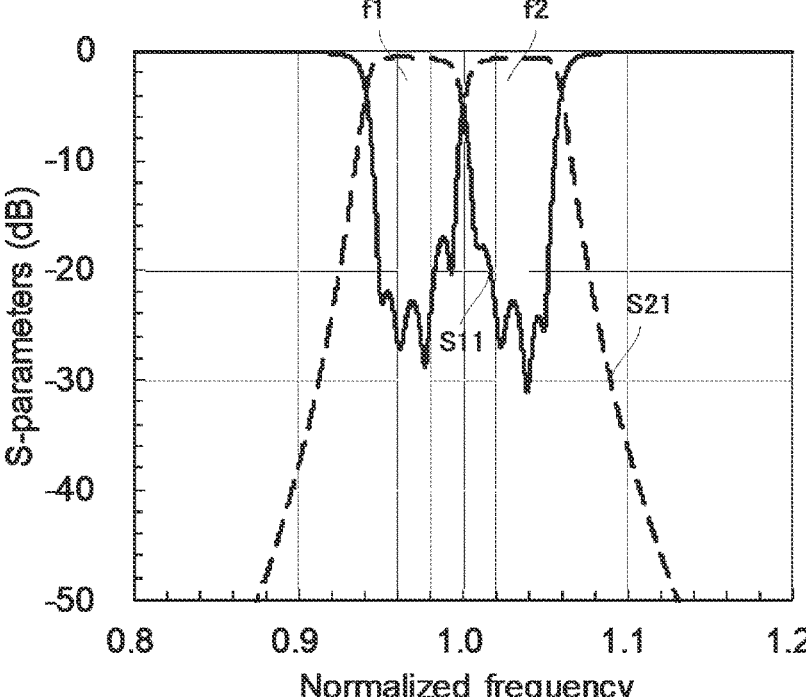
[Fig. 7]
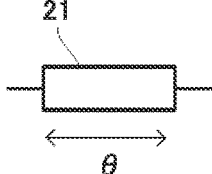

[Fig. 8]
[Fig. 9]
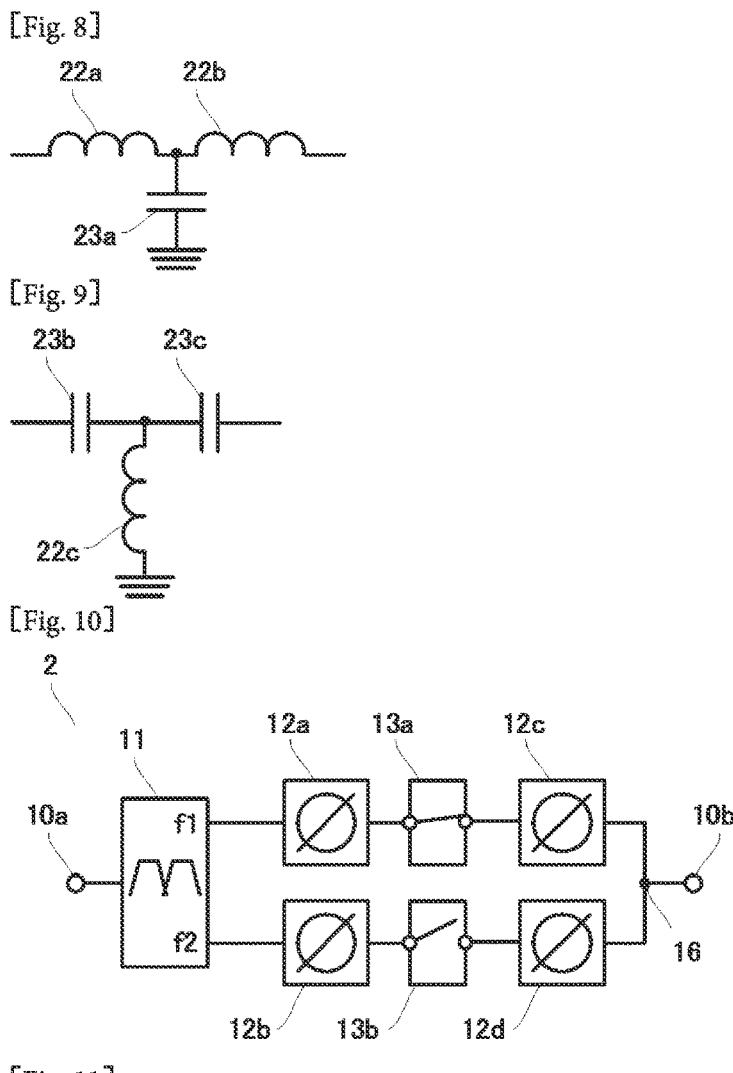
[Fig. 10]
[Fig. 11]
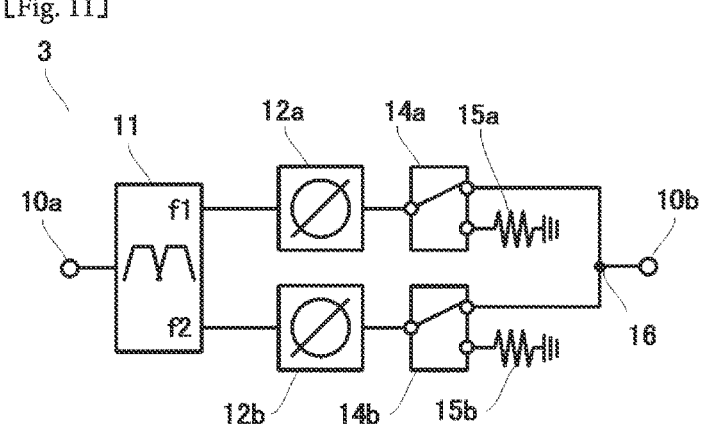
[Fig. 12]
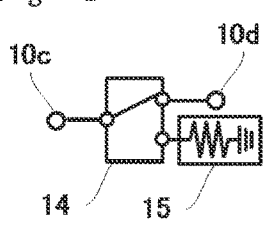

[Fig. 13]
[Fig. 14]
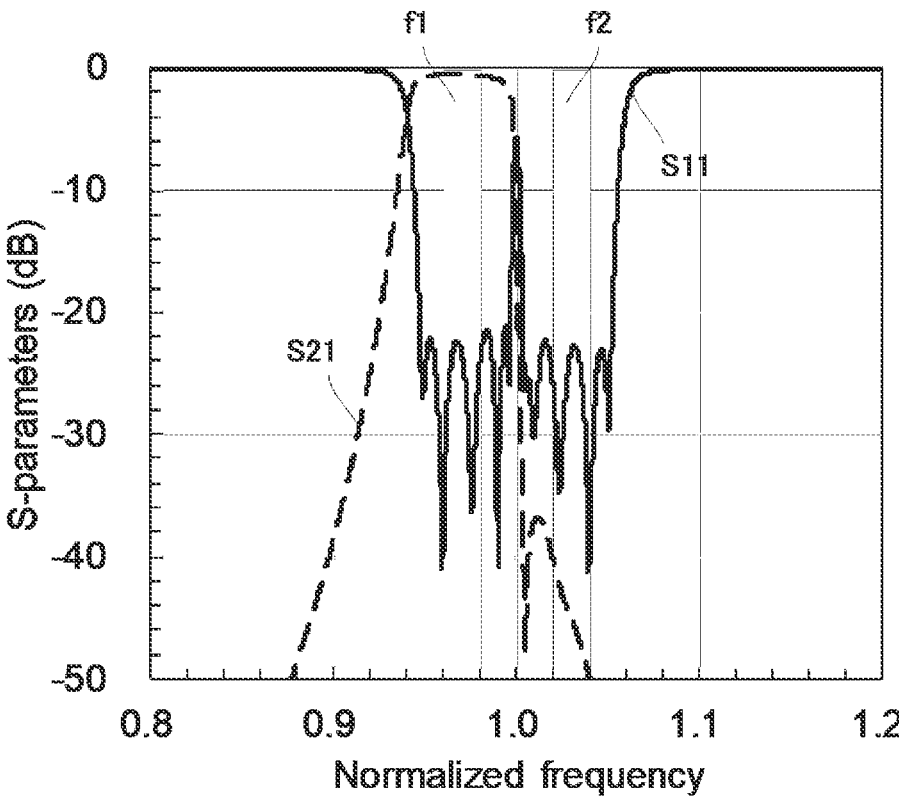

[Fig. 15]
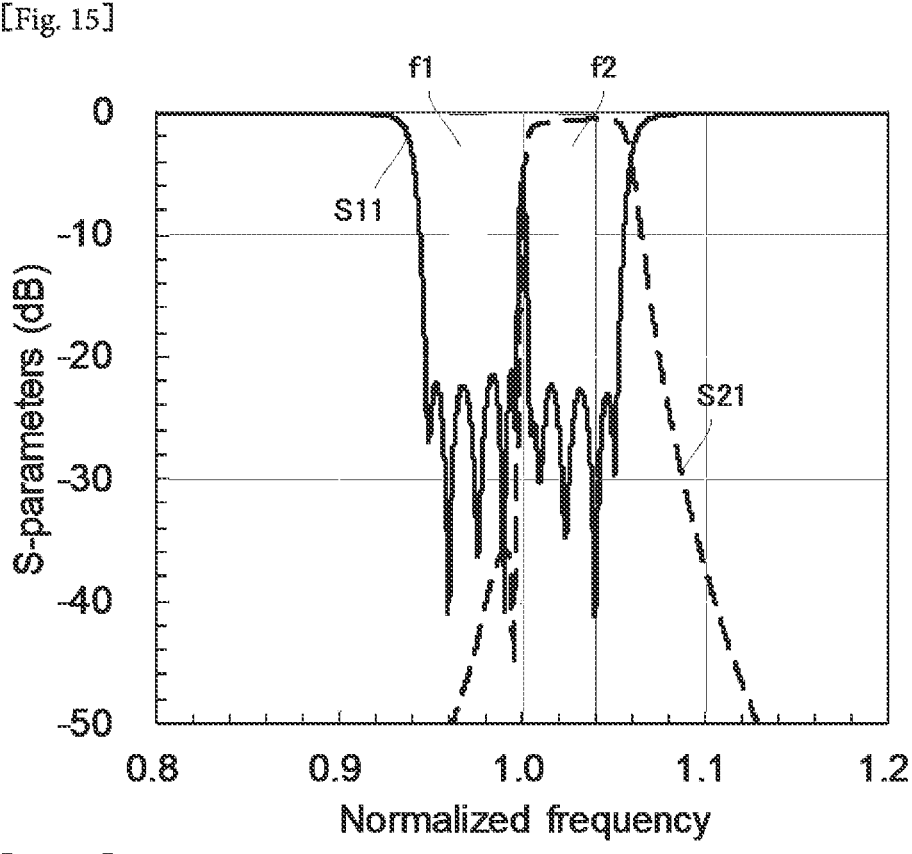
[Fig. 16]
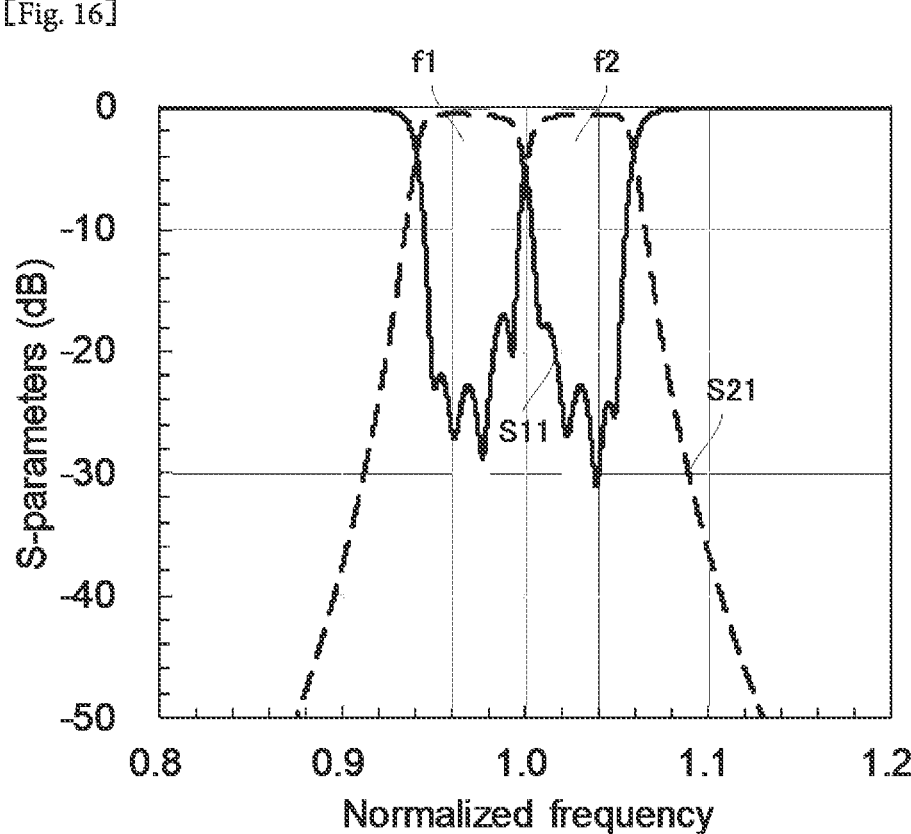

FREQUENCY SELECTING/SWITCHING CIRCUIT

CROSS REFERENCE TO RELATED APPLICATIONS

This application is a Continuation of PCT International Application No. PCT/JP2021/030941, filed on Aug. 24, 2021, which is hereby expressly incorporated by reference into the present application.

TECHNICAL FIELD

The present invention mainly relates to a frequency filter that performs filtering in a frequency domain.

BACKGROUND ART

In various radars and communication devices, a frequency filter (hereinafter, referred to as a filter) that suppresses an unnecessary frequency component and passes only a desired frequency component is an indispensable device. In recent years, there has been an increase in the use of multiple frequency bands in a single device. In addition, for the effective use of frequency resources or for the advancement of radar and communication systems, a device whose operating frequency can be more flexibly changed is required, and the necessity of a filter that satisfies the above requirement is increasing. Patent Document 1 discloses a method of constructing a band pass filter having two pass bands, that is, a so-called dual band filter, by combining two filters having different operating frequencies and two impedance matching circuit pairs. Here, the operating frequency refers to the center frequency of the passband of a filter.

PRIOR ART DOCUMENT

Patent Document

[Patent Document 1] Japanese Unexamined Patent Publication No. H08-321738

SUMMARY OF INVENTION

Problems to be Solved by Invention

For example, in radio communication, cognitive radio has been proposed in which a user terminal or a base station monitors a surrounding radio wave condition and freely changes a frequency or a scheme according to the condition to perform communication.

In cognitive radio, a device is required to be compatible with a plurality of communication systems and their frequencies, and to be capable of selecting and outputting either one of them in addition to outputting both of them. However, because the circuit according to the prior art passes both of the two predetermined frequency signals, there is a problem that a frequency band to be used cannot be selected after shipment of the device. The present invention has been made in view of the above-described problem of the conventional techniques, and an object thereof is to provide a frequency selecting/switching circuit capable of dynamically switching the output of either one or both of the two frequency bands.

Means for Solving Problems

A frequency selecting/switching circuit according to the present disclosure includes: an input terminal to input a signal; an output terminal to output a signal; a two-way splitter circuit that has an input end connected to the input terminal, splits the signal inputted to the input terminal into a first frequency component and a second frequency component, and outputs the first frequency component to a first output end and the second frequency component to a second output end; a first phase-adjusting circuit having a first end connected to the first output end of the two-way splitter circuit; a second phase-adjusting circuit having a first end connected to the second output end of the two-way splitter circuit; a first switch having an input end connected to a second end of the first phase-adjusting circuit and an output end directly or indirectly connected to the output terminal, the first switch being configured to switch an output of a signal inputted to the input end, to the output end between a conductive state and a non-conductive state; and a second switch having an input end connected to a second end of the second phase-adjusting circuit and an output end directly or indirectly connected to the output terminal, the second switch being configured to switch an output of a signal inputted to the input end, to the output end between the conductive state and the non-conductive state. When a signal having the frequency of the second frequency component passes through the first switch in the conductive state and the first phase-adjusting circuit, is reflected at the first output end of the two-way splitter circuit, and passes again through the first phase-adjusting circuit and the first switch in the conductive state, the first phase-adjusting circuit adjusts the phase of the signal outputted last from the first switch and the phase of the signal inputted first to the first switch to the same phase. When a signal having the frequency of the first frequency component passes through the second switch in the conductive state and the second phase-adjusting circuit, is reflected at the second output end of the two-way splitter circuit, and passes again through the second phase-adjusting circuit and the second switch in the conductive state, the second phase-adjusting circuit adjusts the phase of the signal outputted last from the second switch and the phase of the signal inputted first to the second switch to the same phase.

Effects of Invention

According to the present invention, it is possible to realize a frequency selecting/switching circuit capable of dynamically switching the output of either one or both of the two frequency bands.

BRIEF DESCRIPTION OF DRAWINGS

FIG. 1 is a block diagram showing an operation state of a frequency selecting/switching circuit 1 according to Embodiment 1.

FIG. 2 is a circuit diagram showing an ON state of a single switch.

FIG. 3 is a circuit diagram showing an OFF state of the single switch.

FIG. 4 is a circuit simulation result showing a characteristic example (example of outputting only a frequency component $f_1$) of the frequency selecting/switching circuit 1 according to Embodiment 1.

FIG. 5 is a circuit simulation result showing a characteristic example (example of outputting only a frequency component $f_2$) of the frequency selecting/switching circuit 1 according to Embodiment 1.

FIG. 6 is a circuit simulation result showing a characteristic example (example of outputting both of the frequency components $f_1$ and $f_2$) of the frequency selecting/switching circuit 1 according to Embodiment 1.

FIG. 7 is a circuit diagram showing a configuration example of a phase-adjusting circuit.

FIG. 8 is a circuit diagram showing a configuration example of the phase-adjusting circuit.

FIG. 9 is a circuit diagram showing a configuration example of the phase-adjusting circuit.

FIG. 10 is a block diagram showing an operation state of a frequency selecting/switching circuit according to Embodiment 2.

FIG. 11 is a block diagram showing an operation state of a frequency selecting/switching circuit according to Embodiment 3.

FIG. 12 is a circuit diagram showing an SP2T switch and a terminating resistor in a state where outputs are switched.

FIG. 13 is a circuit diagram showing the SP2T switch and the terminating resistor in a state where the outputs are switched.

FIG. 14 is a circuit simulation result showing a characteristic example (example of outputting only a frequency component $f_1$) of a frequency selecting/switching circuit 3 according to Embodiment 3.

FIG. 15 is a circuit simulation result showing a characteristic example (example of outputting only a frequency component $f_2$) of the frequency selecting/switching circuit 3 according to Embodiment 3.

FIG. 16 is a circuit simulation result showing a characteristic example (example of outputting both of the frequency components $f_1$ and $f_2$) of the frequency selecting/switching circuit 3 according to Embodiment 3.

EMBODIMENTS FOR CARRYING OUT INVENTION

Embodiment 1

Hereinafter, embodiments will be described with reference to the drawings. In the drawings, the same or similar parts are denoted by the same reference numerals.

FIG. 1 is a block diagram showing an operation state of a frequency selecting/switching circuit 1 according to Embodiment 1 of the present disclosure.

The frequency selecting/switching circuit 1 according to the present embodiment includes an input terminal 10a for inputting a signal, an output terminal 10b for outputting a signal, a two-way splitter circuit 11 for splitting the inputted signal according to its frequency components f1 (a first frequency component) and f2 (a second frequency component) and outputting the split signal, a first switch 13a for switching the output of the inputted signal between a conductive (ON) state and a non-conductive (OFF) state, a second switch 13b, a first phase-adjusting circuit 12a, a second phase-adjusting circuit 12b, and a branch point 16.

An input terminal 10a is connected to an input (input end) of the two-way splitter circuit 11; of the outputs of the two-way splitter circuit 11, a terminal (first output end) for outputting f1 is connected to one end (first end) of the first phase-adjusting circuit 12a; of the outputs of the two-way splitter circuit 11, a terminal (second output end) for outputting f2 is connected to one end (first end) of the second phase-adjusting circuit 12b; the other end (second end) of the first phase-adjusting circuit 12a is connected to the input (input end) of the first switch 13a; the other end (second end) of the second phase-adjusting circuit 12b is connected to the input (input end) of the second switch 13b; the outputs (output ends) of the first switch 13a, the output (output end)

of the second switch 13b, and the output terminal 10b are connected to the branch point 16. The branch point 16 is connected to the output terminal 10b.

By switching either or both of the states of the first switch 13a and the second switch 13b, the frequency selecting/switching circuit 1 according to the present embodiment can output either one of the frequency components $f_1$ and $f_2$ outputted from the two-way splitter circuit 11, or can output both of the frequency components $f_1$ and $f_2$. Next, the operation will be described.

In describing the operation of the frequency selecting/switching circuit 1 according to the present embodiment, the definitions of the operation states of the switches will be described first. FIG. 2 and FIG. 3 are circuit diagrams showing the conductive (ON) state and the non-conductive (OFF) state of the switch 13a or 13b in the frequency selecting/switching circuit 1 of the present embodiment. The term "conductive" as used herein means electrically connected in the used frequency band, and the term "non-conductive" as used herein means not electrically connected. Note that FIG. 2 and FIG. 3 are circuit diagrams for showing the ON or OFF states of the switches 13a and 13b, which are each represented as a switch 13 without distinction. In FIG. 2 and FIG. 3, an input terminal 10c is connected to the input side of the switch 13, and an output terminal 10d is connected to the output side of the switch 13.

In the present embodiment, for the sake of simplicity, the switch 13 is lossless, and in the ON state shown in FIG. 2, between the input terminal 10c and the output terminal 10d, the pass amplitude is 1 and the pass phase is $\theta_s$ regardless of the frequency. In the OFF state shown in FIG. 3, the pass amplitude between the input terminal 10c and the output terminal 10d is 0 regardless of the frequency, and the reflection amplitude of the output terminal 10d is 1 and the reflection phase is $\varphi_s$. Here, the pass phase $\theta_s$ and the reflection phase $\varphi_s$ are both functions with the frequency as a variable. In the present embodiment, in order to describe a basic operation principle, the reflection phase $\varphi_s$ is treated as 0 degrees regardless of the frequency. The first phase-adjusting circuit 12a and the second phase-adjusting circuit 12b are circuits having functions to adjust the phases of inputted high frequency signals without changing their amplitudes.

First, a case will be considered in which the frequency selecting/switching circuit 1 of the present embodiment outputs only the frequency component $f_1$. In this case, the first switch 13a is set to the ON state, and the second switch 13b is set to the OFF state. Accordingly, the reflection amplitude is 1 and the reflection phase is 0 on the side of the second switch 13b from the branch point 16 (hereinafter referred to as the lower side); thus, the path on the lower side from the branch point 16 is electrically invisible, and the signal outputted from the first switch 13a is outputted to the output terminal 10b as it is. As described above, among the signals inputted from the input terminal 10a, the frequency component $f_1$ passes through the two-way splitter circuit 11, the first phase-adjusting circuit 12a, and the first switch 13a in this order, and is outputted from the output terminal 10b as it is.

Similarly, a case will be considered in which the frequency selecting/switching circuit 1 of the present embodiment outputs only the frequency component $f_2$. In this case, the first switch 13a is set to the OFF state and the second switch 13b is set to the ON state. Accordingly, the reflection amplitude is 1 and the reflection phase is 0 on the side of the first switch 13a from the branch point 16 (hereinafter referred to as the upper side); thus, the path on the upper side from the branch point 16 is electrically invisible, and the signal outputted from the second switch 13*b* is outputted to the output terminal 10*b* as it is. As described above, among the signals inputted from the input terminal 10*a*, the frequency component $f_2$ passes through the two-way splitter circuit 11, the second phase-adjusting circuit 12*b*, and the second switch 13*b* in this order, and is outputted from the output terminal 10*b* as it is.

Lastly, a case will be considered in which the frequency selecting/switching circuit 1 of the present embodiment simultaneously outputs both of the frequency components $f_1$ and $f_2$. In this case, the first and second switches 13*a* and 13*b* are both set to the ON state. In this state, if the lower side from the branch point 16 is open at the frequency component $f_1$ and the upper side from the branch point 16 is open at the frequency component $f_2$, both of the frequency components $f_1$ and $f_2$ can be outputted at the same time. Assuming that the pass phase of the first phase-adjusting circuit 12*a* at $f_2$ is $\theta_1(f_2)$, the pass phase of the first switch 13*a* in the ON state at $f_2$ is $\theta_s(f_2)$, and the reflection phase of the $f_1$ output terminal of the two-way splitter circuit 11 at $f_2$ is $\varphi_{d1}(f_2)$, the conditional expression that the path of the upper side from the branch point 16 is open at $f_2$ is expressed by Equation (1).

$$2(\theta_S(f_2)+\theta_1(f_2))-\varphi_{d1}(f_2)=\pm 2n\pi \qquad (1)$$

Here, n=0, 1, 2, . . . in Equation (1). Assuming similarly that the pass phase of the second phase-adjusting circuit 12*b* at $f_1$ is $\theta_2(f_1)$, the pass phase of the second switch 13*b* in the ON state at $f_1$ is $\theta_s(f_1)$, and the reflection phase of the $f_2$ output terminal of the two-way splitter circuit 11 at $f_1$ is $\varphi_{d2}(f_1)$, the conditional expression that the path on the lower side from the branch point 16 is open at $f_1$ is expressed by Equation (2) below.

$$2(\theta_S(f_1)+\theta_2(f_1))-\varphi_{d2}(f_1)=\pm 2m\pi \qquad (2)$$

Here, m=0, 1, 2, . . . in Equation (2). Therefore, by designing so as to satisfy Equation (1) and Equation (2) at the same time, the frequency components $f_1$ and $f_2$ can be outputted at the same time. In an actual design, the pass phases $\theta_1$ and $\theta_2$ of the first and second phase-adjusting circuits 12*a* and 12*b* should be designed to satisfy the Equations (1) and (2) according to the reflection phases $\varphi_{d1}$ and $\varphi_{d2}$ of the two-way splitter circuit 11 and the pass phases $\theta_s$ of the first and second switches 13*a* and 13*b* to be used.

FIG. 4, FIG. 5, and FIG. 6 are circuit simulation results showing examples of characteristics of the frequency selecting/switching circuit 1 in the present embodiment; FIG. 4, FIG. 5, and FIG. 6 are simulation results when only $f_1$ is outputted, when only $f_2$ is outputted, and when both $f_1$ and $f_2$ are outputted, respectively. The setting (ON or OFF) of the first and second switches 13*a* and 13*b* for realizing each output is as described above. In each of FIG. 4, FIG. 5, and FIG. 6, the horizontal axis represents the normalized frequency, and the vertical axis represents the amplitude of the S parameter when the input terminal 10*a* is Port 1 and the output terminal 10*b* is Port 2. The solid line and the broken line in each figure indicate amplitudes of S11 (input reflection coefficient) and S21 (transmission coefficient from the input terminal to the output terminal), respectively. As can be seen from the figures, it can be confirmed that three states of outputting only $f_1$, outputting only $f_2$, and simultaneously outputting $f_1$ and $f_2$ can be realized by changing the settings of the first and second switches 13*a* and 13*b*.

As described above, by switching either or both of the states of the first switch 13*a* and the second switch 13*b*, the frequency selecting/switching circuit 1 according to the present embodiment can output either one of the frequency components $f_1$ and $f_2$ outputted from the two-way splitter circuit 11, or can output both of the frequency components $f_1$ and $f_2$.

The phase-adjusting circuits 12*a* and 12*b* described in Embodiment 1 are used for adjusting only the phases without changing the pass amplitudes. Therefore, they can be realized by using transmission lines such as microstrip lines or coaxial lines. Further, by using the transmission lines and lumped parameter elements in combination, it is also possible to realize desired phases while achieving miniaturization. FIG. 7, FIG. 8, and FIG. 9 show configuration examples of the phase-adjusting circuits. FIG. 7 shows a transmission line 21 whose electrical length $\theta$ is designed to be equal to $\theta_1(f_2)$ and $\theta_2(f_1)$ obtained from Equation (1) and Equation (2), so that desired phases can be realized.

FIG. 8 and FIG. 9 show phase-adjusting circuits configured with an inductor 22*a*, an inductor 22*b*, an inductor 22*c*, a capacitor 23*a*, a capacitor 23*b*, and a capacitor 23*c*. The phase-adjusting circuit shown in FIG. 8 includes the series inductors 22*a* and 22*b*, and the parallel capacitor 23*a* arranged between the inductors; on the other hand, the phase-adjusting circuit shown in FIG. 9 includes the series capacitors 23*b* and 23*c*, and the parallel inductor 22*c* arranged between the capacitors. Both can realize pass phases with different signs from each other. The phase-adjusting circuits shown in FIG. 8 and FIG. 9 are configured by connecting lumped parameter elements so as to realize the circuit diagrams shown in the respective figures, and are configured by periodically arranging the circuit of FIG. 8 or FIG. 9 as a unit structure. In addition, a configuration example of a phase-adjusting circuit using the circuits of FIG. 7, FIG. 8, and FIG. 9 in combination is also conceivable. Note that, in the present embodiment, configuration examples of a typical phase-adjusting circuit are described on the basis of FIG. 7, FIG. 8, and FIG. 9; however, these do not limit the scope of the present disclosure. As described above, the phase-adjusting circuit refers to a circuit having a function of adjusting only the pass phase without changing the pass amplitude as much as possible, and other configurations may be adopted as long as the circuit has the above function.

Embodiment 2

In Embodiment 1, a case has been described in which the reflection phase φs is treated as 0 degrees regardless of the frequency, that is, a case has been described in which the switch is ideally open. In the present embodiment, a case will be described in which characteristics of a switch to be actually used are considered. FIG. 10 is a block diagram illustrating an operation state of a frequency selecting/switching circuit 2 according to the present embodiment of the present disclosure. The frequency selecting/switching circuit 2 according to the present embodiment includes the input terminal 10*a* for inputting a signal, the output terminal 10*b* for outputting a signal, the two-way splitter circuit 11 for splitting the inputted signal according to its frequency components f1 and f2 and outputting the split signal, the first switch 13*a* for switching the output of the inputted signal between a conductive (ON) state and a non-conductive (OFF) state, the second switch 13*b*, the first phase-adjusting circuit 12*a*, the second phase-adjusting circuit 12*b*, a third phase-adjusting circuit 12*c*, a fourth phase-adjusting circuit 12*d*, and the branch point 16.

The output (output end) of the first switch 13a is connected to one of the terminals (second end) of the third phase-adjusting circuit 12c; the output (output end) of the second switch 13b is connected to one of the terminals (second end) of the fourth phase-adjusting circuit 12d; the other terminal (first end) of the third phase-adjusting circuit 12c, the other terminal (first end) of the fourth phase-adjusting circuit 12d, and the output terminal 10b are connected to the branch point 16. As described above, the frequency selecting/switching circuit 2 according to the present embodiment has a configuration in which the third and fourth phase-adjusting circuits are added between the first switch 13a and the branch point 16 and between the second switch 13b and the branch point 16, respectively, in the frequency selecting/switching circuit 1 according to Embodiment 1.

In the frequency selecting/switching circuit 1 described in Embodiment 1, the reflection phases $\varphi_s$ of the output terminals of the first and second switches 13a and 13b in the OFF states are set to $\varphi_s=0$, and only in this case, by switching the states of the first switch 13a and the second switch 13b, either one of the frequency components $f_1$ and $f_2$ outputted from the two-way splitter circuit 11 can be outputted, or both of the frequency components $f_1$ and $f_2$ can be outputted. On the other hand, by newly introducing the third phase-adjusting circuit 12c and the fourth phase-adjusting circuit 12d, the frequency selecting/switching circuit 2 of the present embodiment can realize the same function as that of the frequency selecting/switching circuit 1 of Embodiment 1 regardless of the reflection phases $\varphi_s$.

Next, the operation will be described. Descriptions overlapping with those in Embodiment 1 will be omitted. In the frequency selecting/switching circuit 2 according to the present embodiment, the state of each of the first and second switches 13a and 13b and the circuit diagram thereof are as shown in FIG. 2 and FIG. 3, and the operation thereof is the same as that in Embodiment 1. However, the reflection phase $\varphi$s of the output terminal 10d in the OFF state shown in FIG. 3 is a function of frequency, and is assumed to take an arbitrary value unlike Embodiment 1. Further, the third phase-adjusting circuit 12c and the fourth phase-adjusting circuit 12d are also circuits having a function of adjusting the phase of the high frequency signal similarly to the first phase-adjusting circuit 12a and the second phase-adjusting circuit 12b.

First, a case will be considered in which the frequency selecting/switching circuit 2 of the present embodiment outputs only the frequency component $f_1$. In this case, the first switch 13a is set to the ON state, and the second switch 13b is set to the OFF state. Accordingly, on the lower side from the branch point 16, the fourth phase-adjusting circuit 12d and the second switch 13b set to the OFF state are connected in this order. The second phase-adjusting circuit 12b ahead of the second switch 13b is electrically isolated because the second switch 13b is set to OFF.

In order to make the path on the lower side from the branch point 16 electrically invisible at the frequency component $f_1$, the path on the lower side from the branch point 16 should be electrically open. The above condition is expressed by Equation (3) below using the output reflection phase $\varphi_s(f_1)$ in the OFF state of the second switch 13b and the pass phase $\theta_4(f_1)$ of the fourth phase-adjusting circuit 12d.

$$2\theta_4(f_1)-\varphi_s(f_1)=\pm2n\pi \qquad (3)$$

Here, n=0, 1, 2, . . . in Equation (3). When Equation (3) is satisfied, the frequency component $f_1$ of the signal inputted from the input terminal 10a of the frequency selecting/switching circuit 2 passes through the two-way splitter circuit 11, the first phase-adjusting circuit 12a, the first switch 13a, and the third phase-adjusting circuit 12c in this order, and is outputted from the output terminal 10b as it is. Similarly, a case will be considered in which the frequency selecting/switching circuit 2 of the present embodiment outputs only the frequency component $f_2$. In this case, the first switch 13a is set to the OFF state and the second switch 13b is set to the ON state. Accordingly, on the upper side from the branch point 16, the third phase-adjusting circuit 12c and the first switch 13a set to the OFF state are connected in this order. The first phase-adjusting circuit 12a ahead of the first switch 13a is electrically isolated because the first switch 13a is set to OFF.

In order to make the path on the upper side from the branch point 16 electrically invisible at the frequency component $f_2$, the path on the upper side from the branch point 16 should be electrically open. The above condition is expressed by Equation (4) below using the output reflection phase $\varphi_s(f_2)$ in the OFF state of the first switch 13a and the pass phase $\theta_3(f_2)$ of the third phase-adjusting circuit 12c.

$$2\theta_3(f_2)-\varphi_s(f_2)=\pm2m\pi \qquad (4)$$

Here, m=0, 1, 2, . . . in Equation (4). When Equation (4) is satisfied, the frequency component $f_2$ of the signal inputted from the input terminal 10a of the frequency selecting/switching circuit 2 passes through the two-way splitter circuit 11, the second phase-adjusting circuit 12b, the second switch 13b, and the fourth phase-adjusting circuit 12d in this order and is outputted from the output terminal 10b as it is.

Lastly, a case will be considered in which the frequency selecting/switching circuit 2 of the present embodiment simultaneously outputs both of the frequency components $f_1$ and $f_2$. In this case, the first switch 13a and the second switch 13b are both set to the ON state. In this state, if the lower side from the branch point 16 is open at the frequency component $f_1$ and the upper side from the branch point 16 is open at the frequency component $f_2$, both of the frequency components $f_1$ and $f_2$ can be outputted at the same time. Assuming that the pass phase of the first phase-adjusting circuit 12a at $f_2$ is $\theta_1(f_2)$, the pass phase of the first switch 13a in the ON state at $f_2$ is $\theta_s(f_2)$, the pass phase of the third phase-adjusting circuit 12c at $f_2$ is $\theta_3(f_2)$, and the reflection phase of the $f_1$ output terminal of the two-way splitter circuit 11 at $f_2$ is $\varphi_{d1}(f_2)$, the conditional expression that the path of the upper side from the branch point 16 is open at $f_2$ is expressed by Equation (5).

$$2(\theta_3(f_2) + \theta_s(f_2) + \theta_1(f_2)) - \phi_{d1}(f_2) = \pm2\,h\pi \qquad (5)$$

Here, h=0, 1, 2, . . . in Equation (5). Assuming similarly that the pass phase of the second phase-adjusting circuit 12b at $f_1$ is $\theta_2(f_1)$, the pass phase of the second switch 13b in the ON state at $f_1$ is $\theta_s(f_1)$, and the pass phase of the fourth phase-adjusting circuit 12d at $f_1$ is $\theta_4(f_1)$, and the reflection phase of the $f_2$ output terminal of the two-way splitter circuit 11 at $f_1$ is $\varphi_{d2}(f_1)$, the conditional expression that the path on the lower side from the branch point 16 is open at $f_1$ is expressed by Equation (6).

$$2(\theta_4(f_1) + \theta_s(f_1) + \theta_2(f_1)) - \phi_{d2}(f_1) = \pm2\,i\pi \qquad (6)$$

Here, i=0, 1, 2, . . . in Equation (6). Therefore, by designing so as to satisfy Equation (5) and Equation (6) at the same time, $f_1$ and $f_2$ can be outputted at the same time. In an actual design, the pass phases $\theta_1$ to $\theta_4$ of the first and fourth phase-adjusting circuits $12a$ to $12d$ should be designed to satisfy the Equations (3) to (6) according to the reflection phases $\varphi_{d1}$ and $\varphi_{d2}$ of the two-way splitter circuit 11 and the pass phases $\theta_s$ of the first switch $13a$ and the second switch $13b$ to be used.

In the frequency selecting/switching circuit 2 described in the present embodiment, by providing the third phase-adjusting circuit $12c$ and the fourth phase-adjusting circuit $12d$, the same function as that of the frequency selecting/switching circuit described in Embodiment 1 can be realized regardless of the reflection phase $\varphi_s$ of the first switch $13a$ and the second switch $13b$. Thus, even when the characteristics of the device cannot be designed, for example, when a commercially available device is used, the three states of outputting only $f_1$, outputting only $f_2$, and outputting $f_1$ and $f_2$ at the same time can be switched by changing the settings of the first switch $13a$ and the second switch $13b$.

Embodiment 3

In the frequency selecting/switching circuit 1 according to Embodiment 1, when only one of the frequency components is outputted, reflection occurs due to the other frequency component. In the present embodiment, a case will be described in which, when only one of the frequency components is outputted, the reflection caused by the other frequency component is reduced. FIG. 11 is a block diagram showing an operation state of a frequency selecting/switching circuit 3 according to the embodiment of the disclosure.

The frequency selecting/switching circuit 3 according to the present embodiment includes the input terminal $10a$ for inputting a signal, the output terminal $10b$ for outputting a signal, the two-way splitter circuit 11 for splitting the inputted signal according to its frequency components $f_1$ and $f_2$ and outputting the split signal, a first SP2T switch $14a$ for switching the output of the inputted signal in two ways, a second SP2T switch $14b$ for switching the output of the inputted signal in two ways, a first terminating resistor $15a$, a second terminating resistor $15b$, the first phase-adjusting circuit $12a$, the second phase-adjusting circuit $12b$, and the branch point 16.

An input terminal $10a$ is connected to an input (first end) of the two-way splitter circuit 11; of the outputs of the two-way splitter circuit 11, a terminal (second end) for outputting the frequency component f1 is connected to one end (first end) of the first phase-adjusting circuit $12a$; of the outputs of the two-way splitter circuit 11, a terminal (third end) for outputting f2 is connected to one end (first end) of the second phase-adjusting circuit $12b$; the other end (second end) of the first phase-adjusting circuit $12a$ is connected to the input (input end) of the first SP2T switch $14a$; the other end (second end) of the second phase-adjusting circuit $12b$ is connected to the input (input end) of the second SP2T switch $14b$; one output end (first output end) of the first SP2T switch $14a$ is connected to the first terminating resistor $15a$; one output end (first output end) of the second SP2T switch $14b$ is connected to the second terminating resistor $15b$; and the other output end (second output end) of the first SP2T switch $14a$, the other output end (second output end) of the second SP2T switch $14b$, and the output terminal $10b$ are connected to the branch point 16.

As described above, the frequency selecting/switching circuit 3 according to the present embodiment has a configuration in which, in the frequency selecting/switching circuit 1 according to Embodiment 1, the first switch $13a$ is replaced with the first SP2T switch $14a$ and the first terminating resistor $15a$, and the second switch $13b$ is replaced with the second SP2T switch $14b$ and the second terminating resistor $15b$. In describing the operation of the frequency selecting/switching circuit 3 according to the present embodiment of the present disclosure, the definitions of the operation states of the SP2T switches will be described first as shown in FIG. 12 and FIG. 13. FIG. 12 and FIG. 13 are circuit diagrams showing states in which the output of the switch $14a$ or the switch $14b$ in the frequency selecting/switching circuit 3 of the present embodiment is switched in two ways. Note that the figures are circuit diagrams for showing the operation states of the SP2T switch $14a$ and the switch $14b$, and both of them are represented as the SP2T switch 14 without distinction.

In each figure, an input side of the SP2T switch 14 is connected to the input terminal $10c$, one output thereof is connected to the output terminal $10d$, and the other output thereof is connected to the terminating resistor 15. Here, a switching state of the switch shown in FIG. 12, that is, a state in which the input terminal $10c$ and the output terminal $10d$ are electrically connected via the SP2T switch 14 is defined as the ON state, and a switching state of the SP2T switch shown in FIG. 13, that is, a state in which the input terminal $10c$ and the terminating resistor 15 are electrically connected via the SP2T switch 14 is defined as the OFF state. In the ON state, a high frequency signal inputted from the input terminal $10c$ is outputted to the output terminal $10d$ via the SP2T switch 14. On the other hand, in the OFF state, the high frequency signal inputted from the input terminal $10c$ is inputted to the terminating resistor 15 via the SP2T switch 14, and is non-reflectively terminated by the terminating resistor 15. In the following description, for the sake of simplicity, the SP2T switch 14 is lossless, and in the ON state shown in FIG. 12, between the input terminal $10c$ and the output terminal $10d$, the pass amplitude is 1 and the pass phase is $\theta_s$ regardless of the frequency. In the OFF state shown in FIG. 13, the pass amplitude between the input terminal $10c$ and the output terminal $10d$ is 0 regardless of the frequency, and the reflection amplitude of the output terminal $10d$ is 1 and the reflection phase is $\varphi_s$. Both the pass phase $\theta_s$ and the reflection phase $\varphi_s$ are functions with frequency as a variable. In the present embodiment, in order to describe a basic operation principle, the reflection phase $\varphi_s$ is treated as 0 degrees regardless of the frequency.

In the frequency selecting/switching circuit 1 described in Embodiment 1, when only the frequency component $f_1$ is outputted, the frequency component $f_2$ is inputted from the input terminal $10a$, outputted from the $f_2$ output terminal of the two-way splitter circuit 11, and inputted to the second phase-adjusting circuit $12b$ and the second switch $13b$. As described above, in a case where only the frequency component $f_1$ is outputted, the second switch $13b$ is set to OFF; therefore, the signal inputted to the second switch $13b$ is reflected, passes through the circuit on the same path as described above in the reverse order, and is finally outputted from the input terminal $10a$. Here, the case has been described in which only the frequency component $f_1$ is outputted; however, also in a case where only $f_2$ is outputted, the frequency component $f_1$ is outputted from the input terminal $10a$ in the same way, although the path is different. Therefore, in the frequency selecting/switching circuit 1 described in Embodiment 1, when only one of the frequency components f1 and f2 inputted from the input terminal $10a$ is outputted from the output terminal $10b$, the other frequency component is reflected inside the circuit and is outputted from the input terminal 10*a* as a reflected wave. Therefore, when a circuit is connected to the preceding stage of the frequency selecting/switching circuit 1, i.e., to the input terminal 10*a*, the input impedance of the frequency selecting/switching circuit 1 as viewed from the circuit greatly changes depending on the operation state of the frequency selecting/switching circuit 1. In particular, when an active circuit such as a power amplifier is connected to the preceding stage of the frequency selecting/switching circuit 1, there is a problem that the power amplifier is likely to be unstable due to such a change in impedance.

On the other hand, in the frequency selecting/switching circuit 3 according to the present embodiment, the first switch 13*a* is replaced with the first SP2T switch 14*a* and the first terminating resistor 15*a*, and the second switch 13*b* is replaced with the second SP2T switch 14*b* and the second terminating resistor 15*b*. Thus, in the SP2T switch 14*a* and the SP2T switch 14*b*, the inputted high frequency signal is outputted from one of the respective outputs in the ON state, and is non-reflectively terminated by the terminating resistor 15*a* and the terminating resistor 15*b* connected to the other of the respective outputs in the OFF state. As a result, in the frequency selecting/switching circuit 3 shown in FIG. 11, even when only one of the frequency components f₁ and f₂ is outputted, the input reflection amplitude at the input terminal 10*a* in the other frequency band can be reduced.

FIG. 14, FIG. 15, and FIG. 16 are circuit simulation results showing examples of characteristics of the frequency selecting/switching circuit 3 in the present embodiment; FIG. 14, FIG. 15, and FIG. 16 are simulation results when only the frequency component f₁ is outputted, when only the frequency component f₂ is outputted, and when both of the frequency component f₁ and the frequency component f₂ are outputted, respectively. Note that the settings (ON or OFF) of the first SP2T switch 14*a* and the second SP2T switch 14*b* for realizing each output are those as described above. In each of the figures, the horizontal axis represents the normalized frequency, and the vertical axis represents the amplitude of the S parameter when the input terminal 10*a* is Port 1 and the output terminal 10*b* is Port 2. The solid line and the broken line in each figure indicate amplitudes of S11 and S21, respectively. When FIG. 4 and FIG. 5 are compared with FIG. 14 and FIG. 15, respectively, it is confirmed that the reflection amplitude at the frequency component f₂ is small when only the frequency component f₁ is outputted, and the reflection amplitude at the frequency component f₁ is small when only the frequency component f₂ is outputted. This shows that the frequency selecting/switching circuit 3 in the present embodiment can reduce the reflection that occurs in the case where only one of the frequency components is outputted in the frequency selecting/switching circuit 1 in Embodiment 1.

In Embodiment 3, the case has been described in which the switch 13*a* is replaced with the SP2T switch 14*a* and the terminating resistor 15*a* and the switch 13*b* is replaced with the SP2T switch 14*b* and the terminating resistor 15*b*, with respect to the frequency selecting/switching circuit 1 described in Embodiment 1; however, the effects described above can be obtained by performing the same replacement for the frequency selecting/switching circuit 2 described in Embodiment 2.

DESCRIPTION OF REFERENCE NUMERALS 1 frequency selecting/switching circuit according to Embodiment 1, 2 frequency selecting/switching circuit according to Embodiment 2,
3 frequency selecting/switching circuit according to Embodiment 3,
10*a* input terminal,
10*b* output terminal,
10*c* input terminal,
10*d* output terminal,
11 two-way splitter circuit,
12*a* to 12*d* first to fourth phase-adjusting circuits,
13*a* first switch,
13*b* second switch,
14*a* first SP2T switch,
14*b* second SP2T switch,
15*a* first terminating resistor,
15*b* second terminating resistor,
16 branch point,
21 transmission line,
22*a* to 22*c* inductor,
23*a* to 23*c* capacitor

The invention claimed is:

1. A frequency selecting/switching circuit comprising:

an input terminal to input a signal;

an output terminal to output a signal;

a two-way splitter circuit that has an input end connected to the input terminal, splits the signal inputted to the input terminal into a first frequency component and a second frequency component, and outputs the first frequency component to a first output end and the second frequency component to a second output end;

a first phase-adjusting circuit having a first end connected to the first output end of the two-way splitter circuit;

a second phase-adjusting circuit having a first end connected to the second output end of the two-way splitter circuit;

a first switch having an input end connected to a second end of the first phase-adjusting circuit and an output end directly or indirectly connected to the output terminal, the first switch being configured to switch an output of a signal inputted to the input end, to the output end between a conductive state and a non-conductive state; and a second switch having an input end connected to a second end of the second phase-adjusting circuit and an output end directly or indirectly connected to the output terminal, the second switch being configured to switch an output of a signal inputted to the input end, to the output end between the conductive state and the non-conductive state, wherein when a signal having a frequency of the second frequency component passes through the first switch in the conductive state and the first phase-adjusting circuit, is reflected at the first output end of the two-way splitter circuit, and passes again through the first phase-adjusting circuit and the first switch in the conductive state, the first phase-adjusting circuit adjusts a phase of the signal outputted last from the first switch and a phase of the signal inputted first to the first switch to a same phase, when a signal having a frequency of the first frequency component passes through the second switch in the conductive state and the second phase-adjusting circuit, is reflected at the second output end of the two-way splitter circuit, and passes again through the second phase-adjusting circuit and the second switch in the conductive state, the second phase-adjusting circuit adjusts a phase of the signal outputted last from the second switch and a phase of the signal inputted first to the second switch to a same phase, the first phase-adjusting circuit is a transmission line whose electrical length $\theta_1$ is equal to $\theta_1(f_2)$ obtained from Equation (1), as follows:

$$2(\theta_s(f_2)+\theta_1(f_2))-\varphi_{d1}(f_2)=\pm 2n\pi \tag{1}$$

here, $\theta_1(f_2)$ is a pass phase of the first phase-adjusting circuit at a frequency component $f_2$, $\theta_s(f_2)$ is a pass phase of the first switch in an ON state at the frequency component $f_2$, $\varphi_{d1}(f_2)$ is a reflection phase of an $f_1$ output terminal of the two-way splitter circuit at the frequency component $f_2$, and n is a natural number including zero; and the second phase-adjusting circuit is a transmission line whose electrical length $\theta_2$ is equal to $\theta_2(f_1)$ obtained from Equation (2), as follows:

$$2(\theta_s(f_1)=\theta_2(f_1))-\varphi_{d2}(f_1)=\pm 2m\pi \tag{2}$$

here, $\theta_2(f_1)$ is a pass phase of the second phase-adjusting circuit at a frequency component $f_1$, $\theta_s(f_1)$ is a pass phase of the second switch in an ON state at the frequency component $f_1$, $\varphi_{d2}(f_1)$ is a reflection phase of an $f_2$ output terminal of the two-way splitter circuit at the frequency component $f_1$, and m is a natural number including zero.

* * * * *